United States Patent [19]
Shinozawa

[11] Patent Number: 5,091,323
[45] Date of Patent: Feb. 25, 1992

[54] PROCESS FOR THE FABRICATION OF BIPOLAR DEVICE

[75] Inventor: Masahiko Shinozawa, Tokyo, Japan

[73] Assignee: Oki Electric Industry Co., Ltd., Minato, Japan

[21] Appl. No.: 704,369

[22] Filed: May 23, 1991

[30] Foreign Application Priority Data

May 30, 1990 [JP] Japan .................. 2-138320

[51] Int. Cl.$^5$ .................. H01L 21/265; H01L 29/73
[52] U.S. Cl. .................. 437/31; 437/26; 437/32; 357/34
[58] Field of Search .............. 437/32, 31, 917, 26; 148/DIG. 10

[56] References Cited

U.S. PATENT DOCUMENTS

| | | | |
|---|---|---|---|
| 4,706,378 | 11/1987 | Havemann | 437/26 |
| 4,783,422 | 11/1988 | Kawkatsu | |
| 4,810,664 | 3/1989 | Kamins et al. | 437/26 |

FOREIGN PATENT DOCUMENTS 3197645  2/1990  Japan .

*Primary Examiner*—Olik Chaudhuri
*Assistant Examiner*—Long Pham
*Attorney, Agent, or Firm*—Spencer & Frank

[57] ABSTRACT

In a process for the fabrication of a bipolar semiconductor device having a substrate, the substrate defining a working surface, and a collector region of a first conductivity type formed within the substrate at a position adjacent to the working surface, a patterned, oxidation-resistant film is formed on a predetermined portion of the collector region. A silicon oxide film region is formed within the collector region at a position spaced downwardly from an exposed surface of the collector region. A selective epitaxial layer of a second conductivity type is formed so that the selected epitaxial layer extends from the exposed surface of the collector region to a portion of a top part of the patterned, oxidation-resistant film. A portion of the patterned, oxidation-resistant film, the portion being free of the selective epitaxial layer, is removed to expose the collector region. A base region of the second conductivity type is formed so that the base region extends from the thus-exposed surface of the collector region to the silicon oxide film region. An emitter region of the first conductivity type is then formed within the base region at a position adjacent to the exposed surface of the collector region.

4 Claims, 11 Drawing Sheets

PROCESS FOR THE FABRICATION OF BIPOLAR DEVICE

BACKGROUND OF THE INVENTION

A bipolar semiconductor device is a semiconductor device in which the flow of minority carriers through a base region is controlled by an injected current. Bipolar semiconductor devices can be structurally classified into vertical transistors and lateral transistors. These devices feature high operating speed and high-power drivability. These bipolar semiconductor devices and their fabrication processes are disclosed, for example, in U.S. Pat. No. 4,783,422.

SUMMARY OF THE INVENTION

An object of the present invention is to provide a process for the fabrication of a bipolar semiconductor device which permits high packing density and high-speed operation.

According to the fabrication process of the present invention, a silicon oxide film region is formed between a base region and a collector region, both inactive regions. This obviates any base-collector junction, so that the base-collector junction contact area is substantially reduced and the base-collector junction capacitance is significantly lowered.

Further, a selective epitaxial layer which serves as an extraction electrode for a base is formed covering a portion of an upper part of an oxidation-resistant film, whereby a conductor pattern to an emitter region is formed by a self-alignment technique.

DETAILED DESCRIPTION OF THE INVENTION

The fabrication process according to the first embodiment of the present invention will now be described with reference to FIGS. 1(A) to 1(G).

Figure 1A:
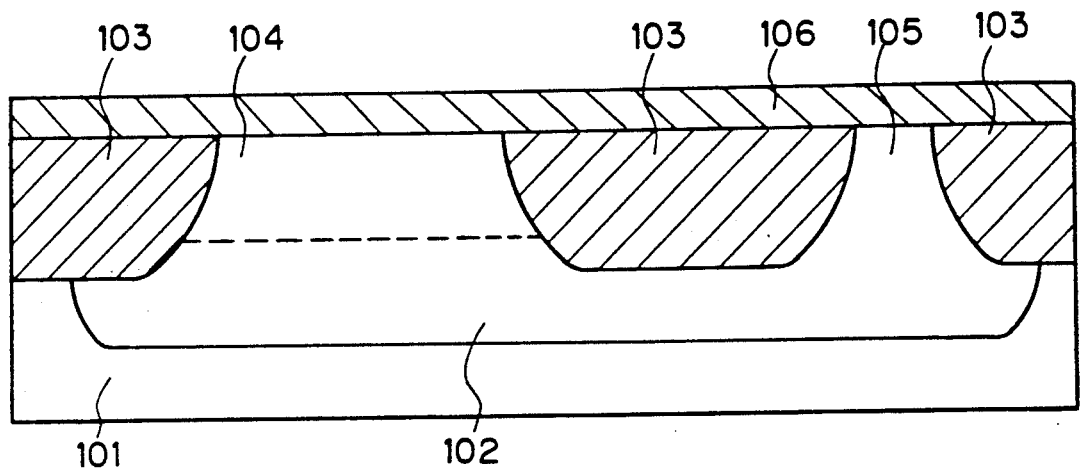
FIGS. 1(A) to 1(G) illustrate a process according to a first embodiment of the present invention for the fabrication of a bipolar transistor device.

As is shown in FIG. 1(A), an N+-type buried layer 102 is formed within a P--type silicon substrate 101. An N--type epitaxial layer is then formed on the N+-type buried layer 102. An isolation oxide film 103 is formed in the N--type epitaxial layer to form a collector region 104, which comprises the remaining epitaxial layer, and a collector lead region 105. Phosphorus is thereafter diffused into the collector lead region 105, whereby the collector lead region 105 is converted to an N+-region. A silicon oxide film of about 200 Å in thickness is then formed over the surfaces of the collector region 104 and collector lead region 105. Further, a silicon nitride film 106 is formed as an oxidation-resistant film of 0.5-1.0 μm in thickness over the entire surface of the silicon oxide film.

Figure 1B:
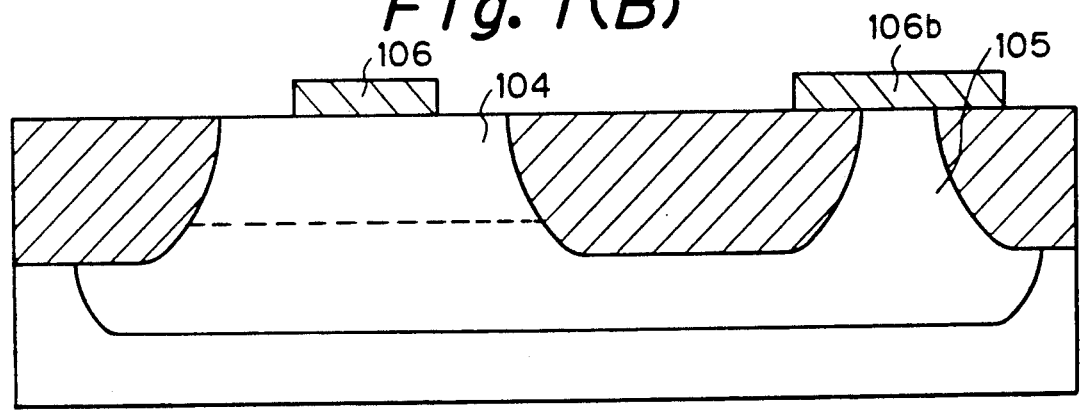

A resist pattern is next formed on the silicon nitride film 106 by a photolithographic technique. As is depicted in FIG. 1(B), the silicon nitride film 106 is etched using the resist pattern as a mask so that patterned silicon nitride films 106a,106b are formed on a central portion of the collector region 104 and on the collector lead region 105, respectively.

Figure 1C:
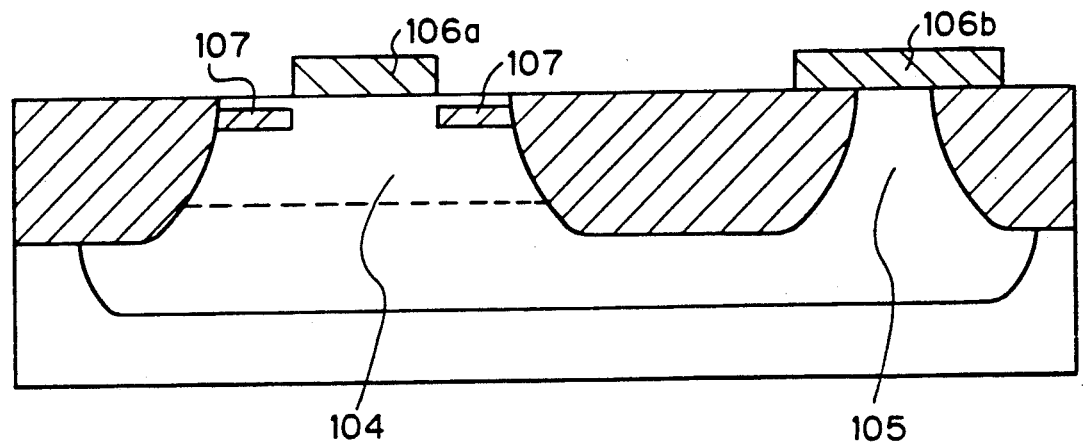

Referring next to FIG. 1(C), O+ (oxygen ions) are implanted into the collector region 104 while using the patterned silicon nitride film 106a as a mask. Upon ion implantation, the acceleration energy and the dosage are set at about 200 keV and at $1.2 \times 10^{18}$ cm$^{-2}$ respectively. Annealing is next conducted at 1,150° C. for 2 hours, whereby the portion of the collector region 104, said portion having been implanted with O+, is converted to a silicon oxide film 107. Under the above conditions, a silicon oxide film 107 of about 3,800 Å in thickness is formed in the collector region 104 at a depth about 1,500 Å below the surface of the collector region 104. No silicon oxide film is however formed in the region right underneath the patterned silicon nitride film 106a because, like the collector lead region 105 covered by the patterned silicon nitride film 106, the patterned silicon nitride film 106a serves as a mask upon ion implantation. The silicon oxide film 107 is formed along the periphery of the collector region 104.

Figure 1D:
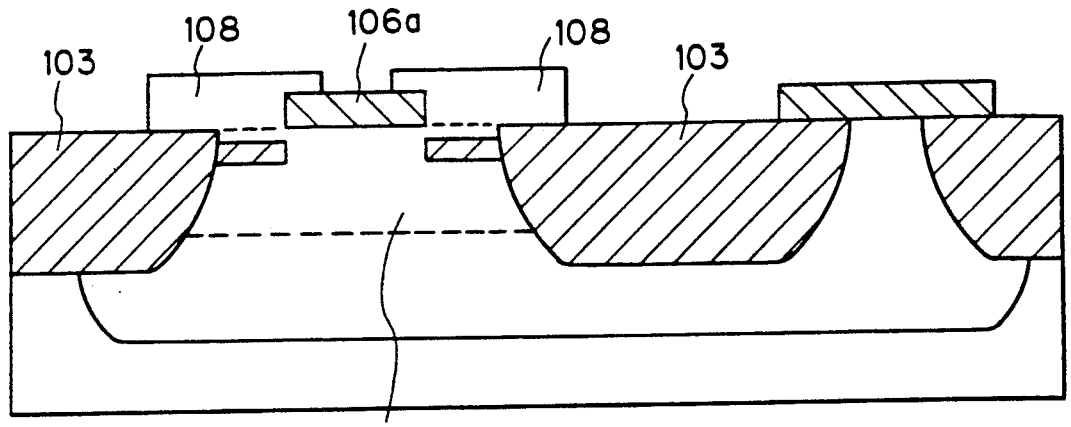

The thin silicon oxide film exposed in the surface of the collector region 104 is next removed. As is shown in FIG. 1(D), selective epitaxial growth of silicon is conducted using as a seed crystal a portion of the collector region 104, said portion lying above the silicon oxide film 107, whereby a selective epitaxial layer 108 is allowed to grow until it covers not only the collector region 104 but also a portion of the patterned silicon nitride film 106a. The portion of the selective epitaxial layer 108, said portion covering the patterned silicon nitride film 106a, undergoes solid-phase growth in a lateral direction. Attention must be paid here to prevent the selective epitaxial layer 108 from contacting with an adjacent selective epitaxial layer 108 of the patterned silicon nitride film 106a The spacing between the left-hand selective epitaxial layer and the right-hand selective epitaxial layer on the patterned silicon nitride film 106a is one of factors which will determine an emitter width and therefore will give significant influence to the performance of a transistor to be fabricated.

Figure 1E:
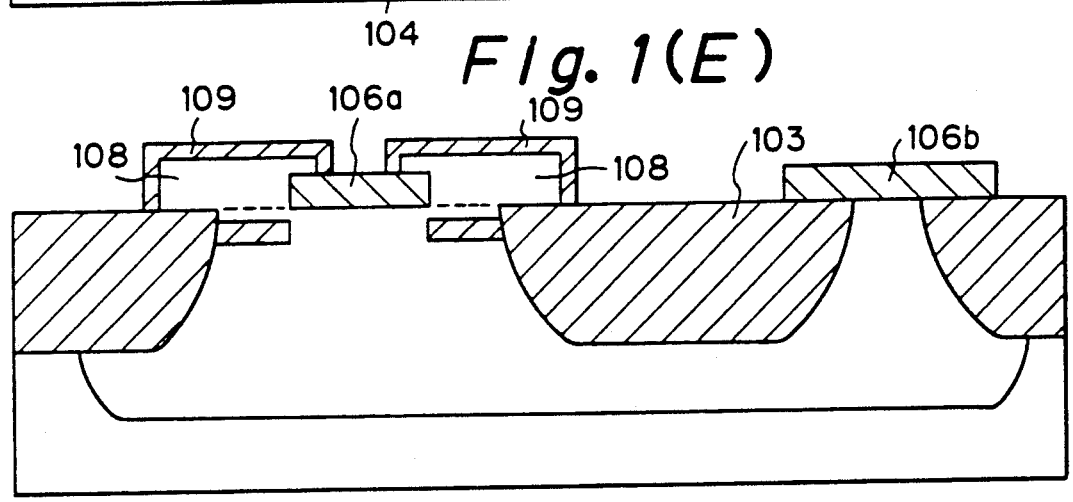

Reference is next had to FIG. 1(E). A surface layer of each selective epitaxial layer is converted to a silicon oxide film 109 by a thermal oxidation process. Through the silicon oxide film 109, B+ (boron ions) are implanted into the selective epitaxial layer 108. No B+ ions are implanted into the regions right underneath the patterned silicon nitride films 106a,106b since these films 106a,106b serve as masks upon ion implantation.

Figure 1F:
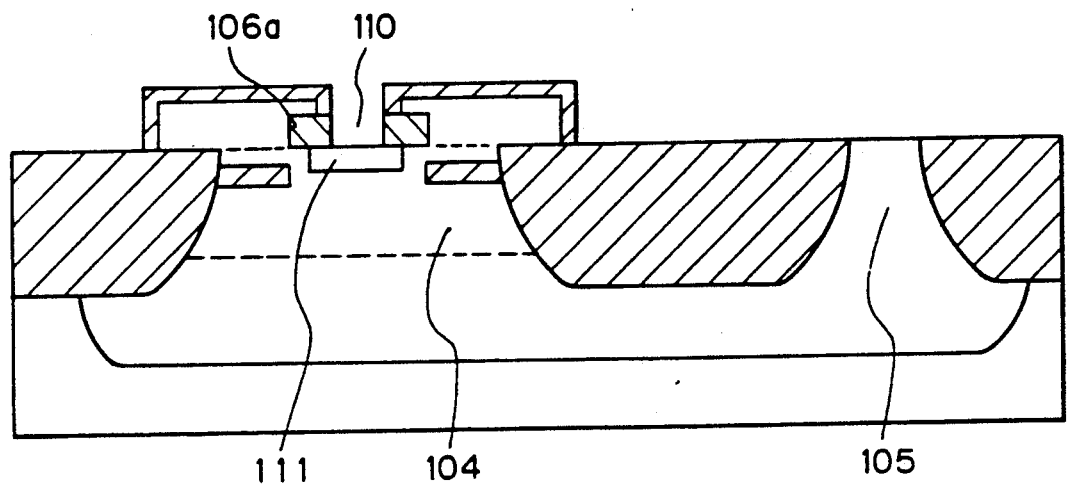

Next, as is illustrated in FIG. 1(F), the silicon nitride films 106a,106b are subjected to etching while using the silicon oxide film 109 and isolation oxide film 103 as masks. As a result, the patterned silicon nitride film 106 is removed and, at the same time, an opening 110 is formed in a central part of the patterned silicon nitride film 106a so that the surface of the collector region 104 is exposed in the bottom of the opening. The collector lead region 105, which has been exposed by the removal of the patterned silicon nitride film 106b, is then covered with a resist by a photolithographical technique. B+ ions are next implanted to a central surface portion of the collector region 104 through the opening 110 so that a P-type region 111 is formed as a base in the central surface portion.

Figure 1G:
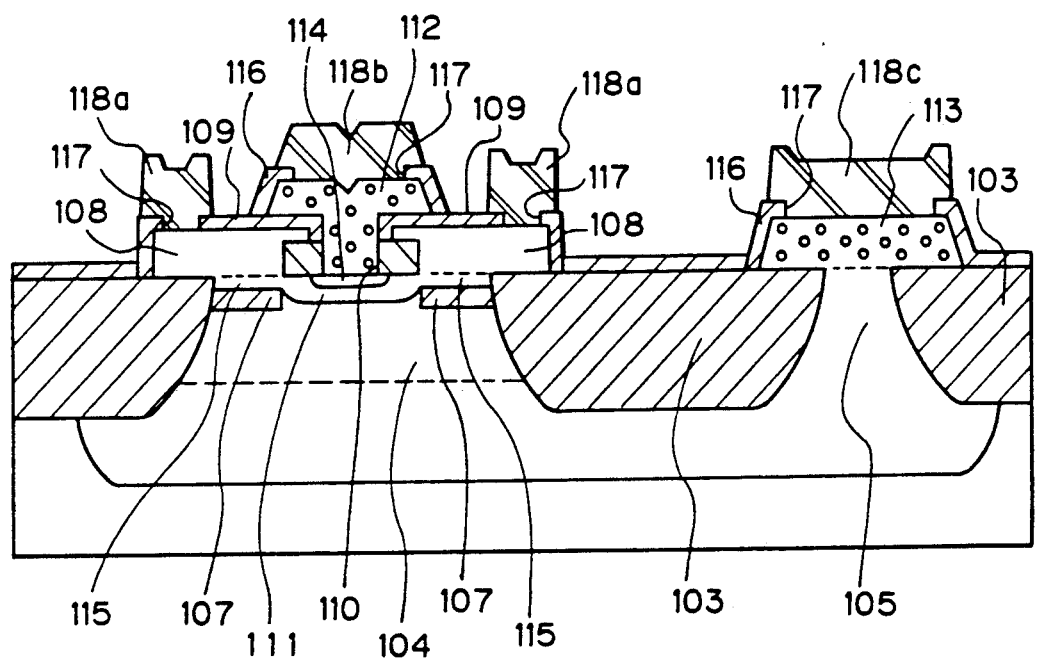

Referring next to FIG. 1(G), the thin silicon oxide films are removed from the surface of the P-type region in the bottom of the opening 110 and also from the collector lead region 105. Polycrystalline silicon is thereafter caused to deposit on the entire surface. After As+ (arsenic ions) are implanted into the polycrystalline silicon, the polycrystalline silicon is patterned by a photolithographic technique so that an emitter electrode 112 of polycrystalline silicon and a collector electrode 113 of polycrystalline silicon are formed. The emitter electrode 112 is formed such that it fills up the opening 110 and also partly covers the surrounding silicon oxide film 109. On the other hand, the collector electrode 113 is formed such that it covers the collector lead region 105 and also extends onto the surrounding isolation oxide film 103.

Heat treatment is thereafter conducted to induce diffusion of arsenic from the emitter electrode 112 into the P-type region 111, whereby an N+-region 114 is formed as an emitter in the P-type region 111. At this time, boron is also caused to diffuse from the selective epitaxial layer 108 into the portion of the collector region 104, said portion lying above the silicon oxide film 107, so that the collector region 104 is converted at the portion to a P-type region 115 as an inactive base connected to the P-type region 111.

Next, a silicon oxide film 116 is formed covering the emitter electrode 112 and the collector electrode 113. Contact holes 117 are then formed through the silicon oxide film 116 and the silicon oxide film 109, respectively. Formed through the contact holes 117 are a base metal electrode 118a, an emitter metal electrode 118b and a collector metal electrode 118c, which are connected to the selective epitaxial layer 108, the emitter electrode 112 and the collector electrode 113 respectively.

A bipolar semiconductor device has hence been completed as described above, in which the bottom surface of the P-type region 115 as the inert base region is in contact with the silicon oxide film 107 and no junction is needed between the P-type region 115 and the collector region 104.

Although the patterned silicon nitride film 106 was used as a mask upon implantation of O+ (oxygen ions) in the first embodiment, the resist pattern employed as a mask upon formation of the patterned silicon nitride film 106a may be allowed to remain and O+ implantation may then be conducted using it as a mask. Boron ions were implanted into the selective epitaxial layer 108 through the silicon oxide film 109 after the silicon oxide film 109 had been formed on the surface of the selective epitaxial layer 108. The selective epitaxial layer 108 may be doped with the impurity concurrently with its growth.

The fabrication process according to the second embodiment of the present invention will now be described with reference to FIGS. 2(A) to 2(L).

Figure 2A:
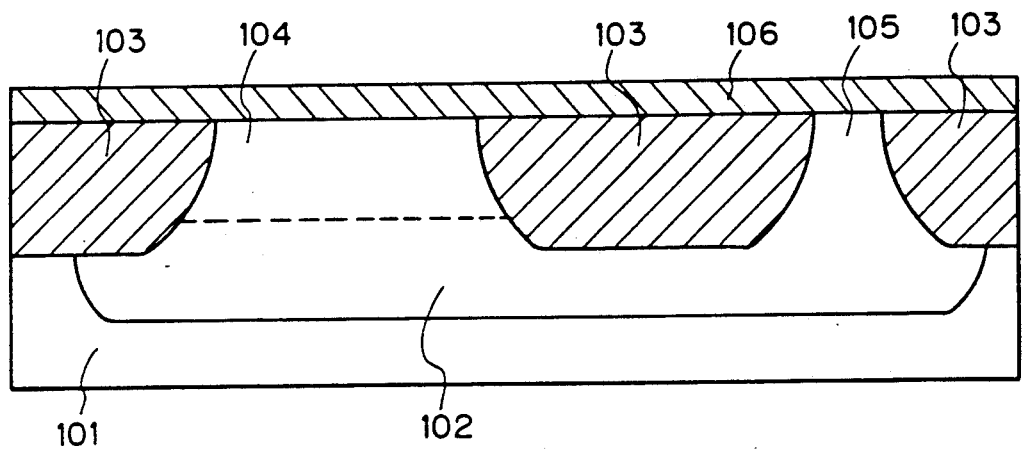
FIGS. 2(A) to 2(L) show a process according to a second embodiment of the present invention for the fabrication of a bipolar transistor device.

As is shown in FIG. 2(A), an N+-type buried layer 102 is formed within a P−-type silicon substrate 101. An N−-type epitaxial layer is then formed on the N+-type buried layer 102. An isolation oxide film 103 is formed in the N−-type epitaxial layer to form a collector region 104, which comprises the remaining epitaxial layer, and a collector lead region 105. Phosphorus is thereafter diffused into the collector lead region 105, whereby the collector lead region 105 is converted to an N+-region. A silicon oxide film of about 200 Å in thickness is then formed over the surfaces of the collector region 104 and collector lead region 105. Further, a silicon nitride film 106 is formed as an oxidation-resistant film of 0.5–1.0 μm in thickness over the entire surface of the silicon oxide film.

Figure 2B:
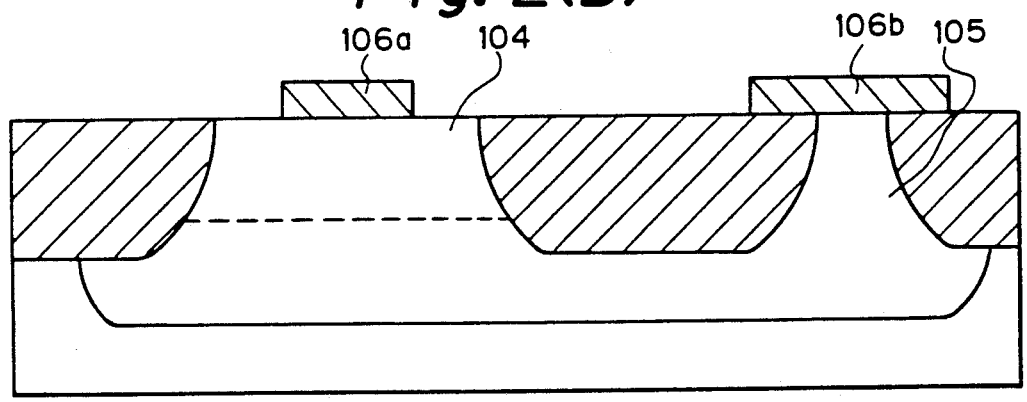

A resist pattern is next formed on the silicon nitride film 106 by a photolithographic technique. As is depicted in FIG. 2(B), the silicon nitride film 106 is etched using the resist pattern as a mask so that patterned silicon nitride films 106a,106b are formed on a central portion of the collector region 104 and on the collector lead region 105, respectively.

Figure 2C:
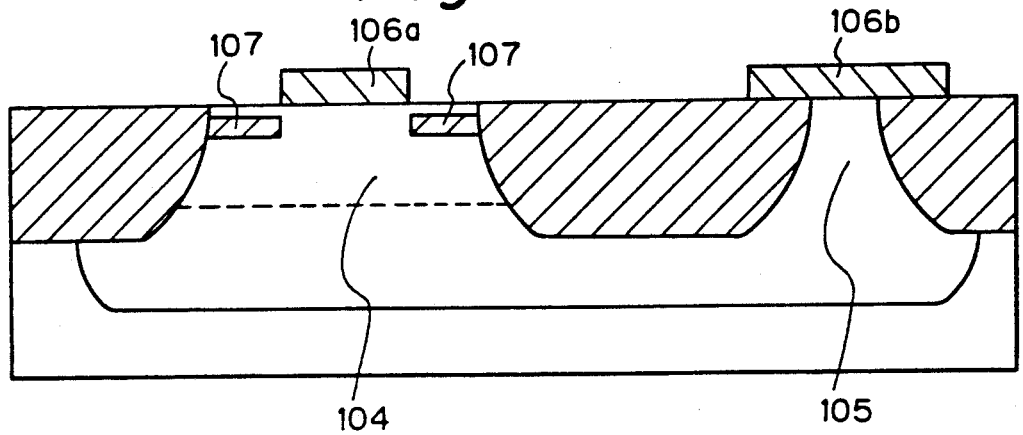

Referring next to FIG. 2(C), O+ (oxygen ions) are implanted at an acceleration energy of about 200 keV into the collector region 104 while using the patterned silicon nitride film 106a as a mask. The dosage is set at $1.2 \times 10^{18}$ cm$^{-2}$. Annealing is next conducted at 1,150° C. for 2 hours, whereby the portion of the collector region 104, said portion having been implanted with O+, is converted to a silicon oxide film 107. Under the above conditions, a silicon oxide film 107 of about 3,800 Å in thickness is formed in the collector region 104 at a depth about 1,500 Å below the surface of the collector region 104. No silicon oxide film is however formed in the region right underneath the patterned silicon nitride film 106a because, like the collector lead region 105 covered by the patterned silicon nitride film 106, the patterned silicon nitride film 106a serves as a mask upon ion implantation. The silicon oxide film 107 is formed along the periphery of the collector region 104.

Figure 2D:
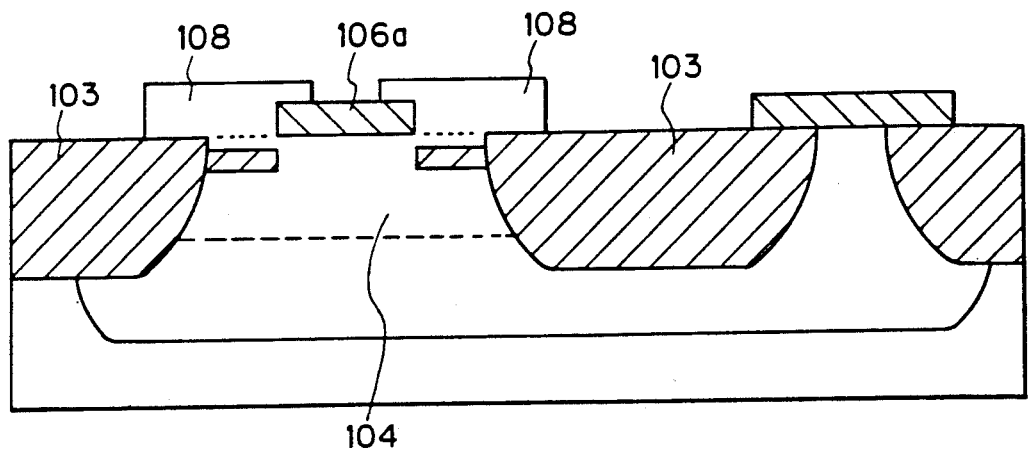

The thin silicon oxide film exposed in the surface of the collector region 104 is next removed. As is shown in FIG. 2(D), selective epitaxial growth of silicon is conducted using as a seed crystal a portion of the collector region 104, said portion lying above the silicon oxide film 107, whereby a selective epitaxial layer 108 is allowed to grow until it covers not only the collector region 104 but also a portion of the patterned silicon nitride film 106a. The portion of the selective epitaxial layer 108, said portion covering the patterned silicon nitride film 106a, undergoes solid-phase growth in a lateral direction. Attention must be paid here to prevent the selective epitaxial layer 108 from contacting with an adjacent selective epitaxial layer 108 on the patterned silicon nitride film 106a. The spacing between the left-hand selective epitaxial layer and the right-hand selective epitaxial layer on the patterned silicon nitride film 106a is one of factors which will determine an emitter width and therefore will give significant influence to the performance of a transistor to be fabricated.

Figure 2E:
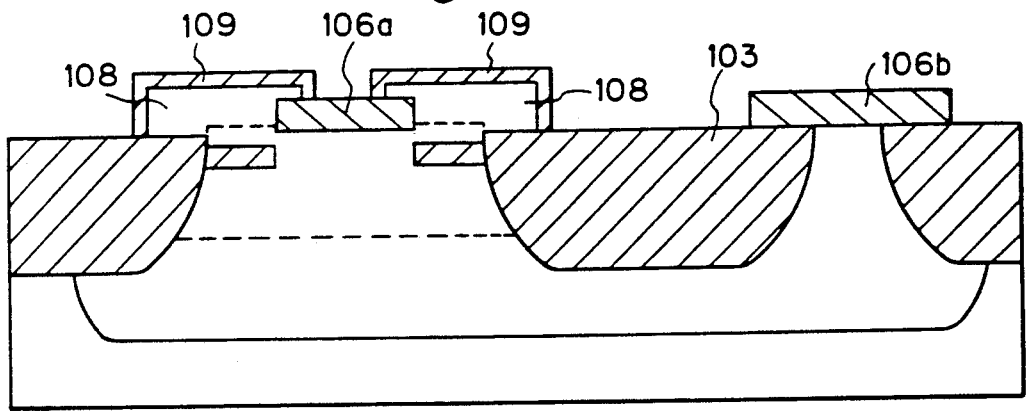

Reference is next had to FIG. 2(E). A surface layer of each selective epitaxial layer is converted to a silicon oxide film 109 by a thermal oxidation process. Through the silicon oxide film 109, B+ (boron ions) are implanted into the selective epitaxial layer 108. No B+ ions are implanted into the regions right underneath the patterned silicon nitride films 106a,106b since these films 106a,106b serve as masks upon ion implantation.

Figure 2F:
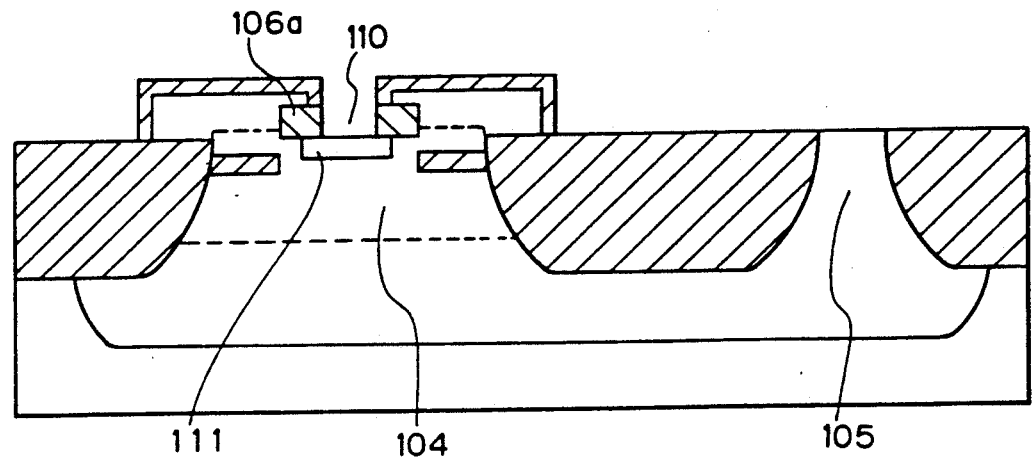

Next, as is illustrated in FIG. 2(F), the silicon nitride films 106a,106b are subjected to etching while using the silicon oxide film 109 and isolation oxide film 103 as masks. As a result, the patterned silicon nitride film 106 is removed and, at the same time, an opening 110 is formed in a central part of the patterned silicon nitride film 106a so that the surface of the collector region 104 is exposed in the bottom of the opening. The collector lead region 105, which has been exposed by the removal of the patterned silicon nitride film 106b, is then covered with a resist by a photolithographic technique. B+ ions are next implanted to a central surface portion of the collector region 104 through the opening 110 so that a P-type region 111 is formed as a base in the central surface portion.

Figure 2G:
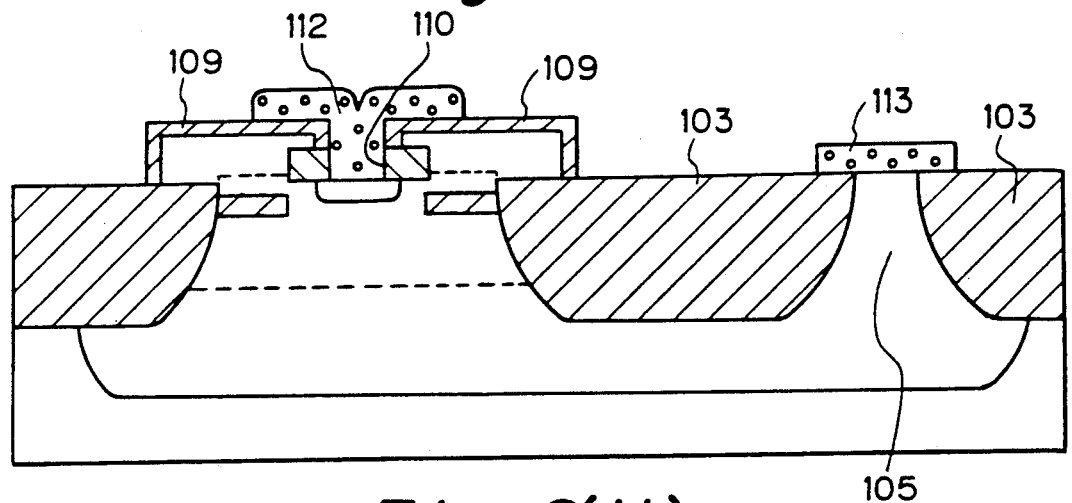

Referring next to FIG. 2(G), the thin silicon oxide films are removed from the surface of the P-type region in the bottom of the opening 110 and also from the collector lead region 105. Polycrystalline silicon is thereafter caused to deposit on the entire surface. After As+ (arsenic ions) are implanted into the polycrystalline silicon, the polycrystalline silicon is patterned by a photolithographic technique so that an emitter electrode 112 of polycrystalline silicon and a collector electrode 113 of polycrystalline silicon are formed. The emitter electrode 112 is formed so that it fills up the opening 110 and also partly covers the surrounding silicon oxide film 109. On the other hand, the collector electrode 113 is formed so that it covers the collector lead region 105 also extends onto the surrounding isolation oxide film 103.

Figure 2H:
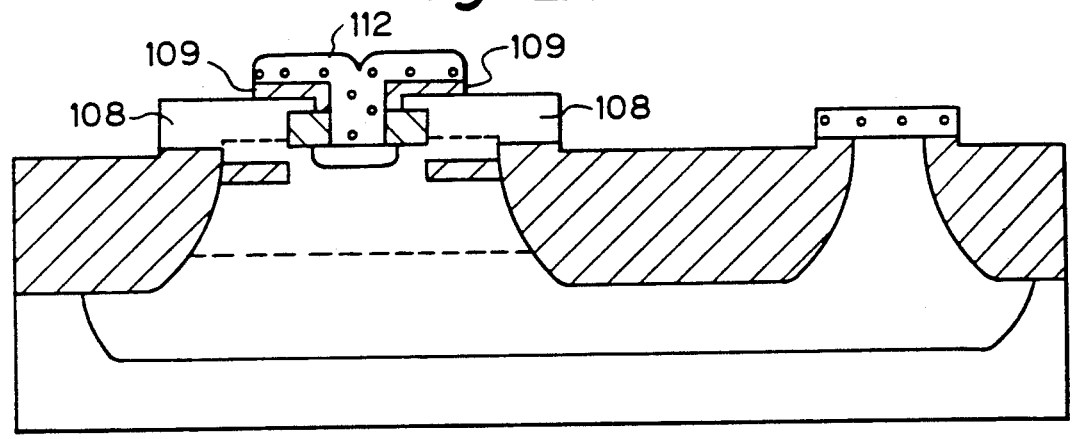

The silicon oxide film 109 is next removed at the portion not covered by the emitter electrode 112, whereby the selective epitaxial layer 108 is exposed as depicted in FIG. 2(H).

Figure 2I:
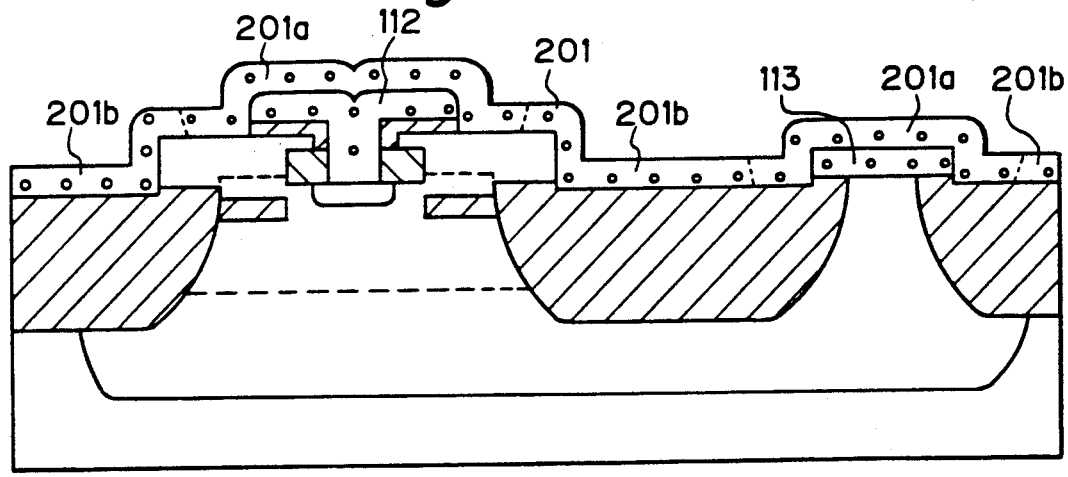

Polycrystalline silicon 201 is then deposited on the entire surface as is illustrated in FIG. 2(I). Application of heat a treatment causes arsenic to diffuse from the emitter electrode 112 and the polycrystalline silicon collector electrode 113 into the polycrystalline silicon 201. Here, the diffusion of arsenic is controlled such that the diffusion takes place for portions 201a of the polycrystalline silicon 201—said portions 201a overlapping with the emitter electrode 112 and the collector electrode 113 and also lying adjacent to the electrodes 112,113—and no arsenic is diffused into the remaining polycrystalline silicon 201b.

Figure 2J:
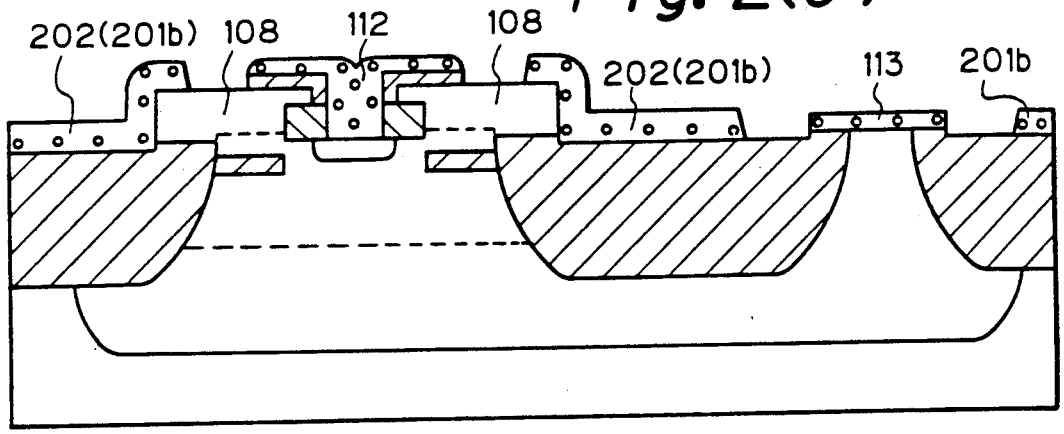

Etching of the polycrystalline silicon 20 is next conducted. In a dry etching apparatus equipped with parallel plate electrodes, this etching is performed under the following conditions: gas composition —CCl$_4$: 4 cc/min, O$_2$: 1 cc/min and He: 10 cc/min; vacuum level: 0.3 Torr; and power: 40 W. Since these etching conditions make the etch rate of polycrystalline silicon having an As concentration of $4 \times 10^{20}$ cm$^{-3}$ about 10 times greater than that of non-doped polycrystalline silicon, the As-doped polycrystalline silicon 201a is predominantly etched out of the polycrystalline silicon 201. As is shown in FIG. 2(J), the polycrystalline silicon 201b is therefore cut off from the polycrystalline silicon emitter and collector electrodes 112,113 after the etching and the polycrystalline silicon 201b remains as a conductor pattern 202 extending from the selective epitaxial layer 108.

Figure 2K:
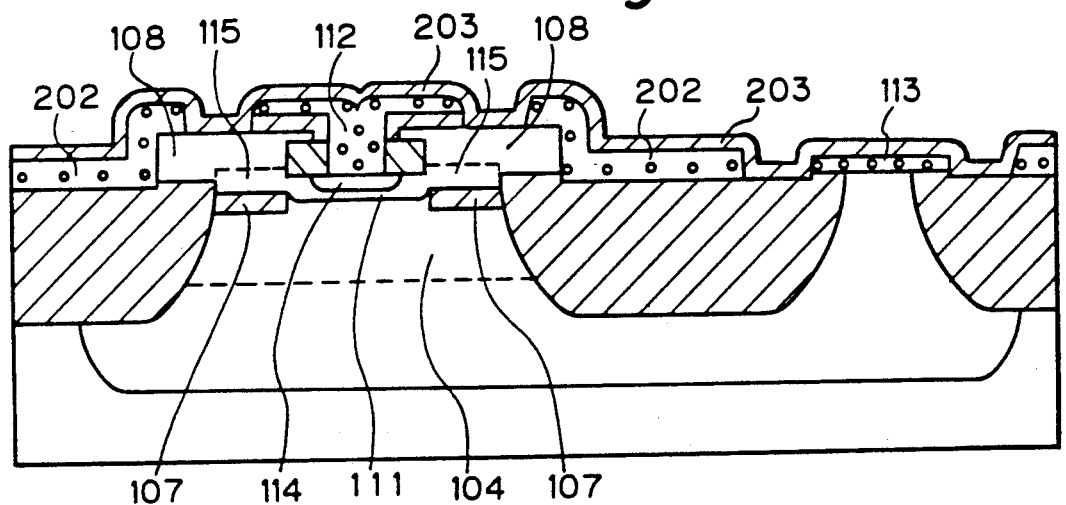

A silicon oxide film 203 is next formed, for example, by a chemical vapor deposition (CVD) process on the entire surface as depicted in FIG. 2(K). A P-type dopant, for example, B+ (boron ions) are then introduced into the conductor pattern 202 of polycrystalline silicon through the silicon oxide film 203. Heat treatment is thereafter conducted to induce diffusion of arsenic from the emitter electrode 112 to the P-type region 111, so that an N+-type region 114 is formed as an emitter within the P-type region 111. Boron is caused to diffuse from the selective epitaxial layer 108 into the portion of the collector region 104, said portion lying above the silicon oxide film 107, at this time. The collector region 104 is therefore converted at the portion to a P-type region 115 as an inert base connected to the P-type region 111.

Figure 2L:
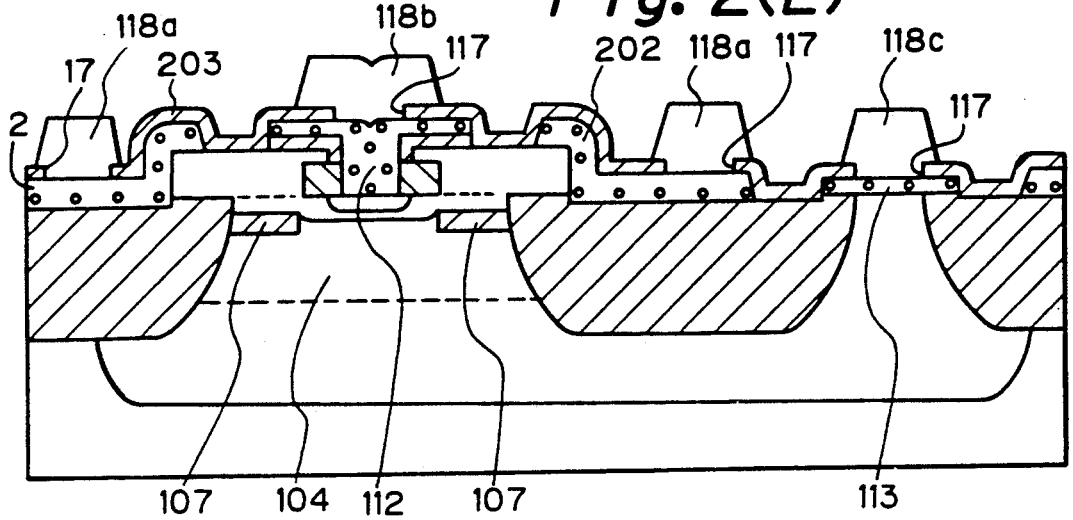

Subsequently, as is shown in FIG. 2(L), contact holes 117 are formed through the silicon oxide film 203 at positions above the emitter electrode 112, the conductor pattern 202 and the collector electrode 113. Formed through the contact holes 117 are an emitter metal electrode 118b, a base metal electrode 118a and a collector metal electrode 118c, which are connected to the emitter electrode 112, the conductor pattern 202 and the collector electrode 113 respectively. Here, it is possible to convert the surfaces of the emitter electrode 112, conductor pattern 202 and collector electrode 113 into a silicide prior to the formation of the metal electrodes 118a–118c.

By forming the conductor pattern 202 of polycrystalline silicon in accordance with the self-alignment technique and establishing a contact with the base metal electrode 118a on the conductor pattern 202 as described above, a bipolar semiconductor device is completed with an emitter contact portion and a base contact portion arranged apart from each other without the need for a large width for the collector region 104. Needless to say, the inactive base-collector junction is also omitted in this device owing to the formation of the silicon oxide film 107.

The fabrication process according to the third embodiment of the present invention, which can be practiced to obtain a similar device, will next be described with reference to FIGS. 3(A) to 3(K).

Figure 3A:
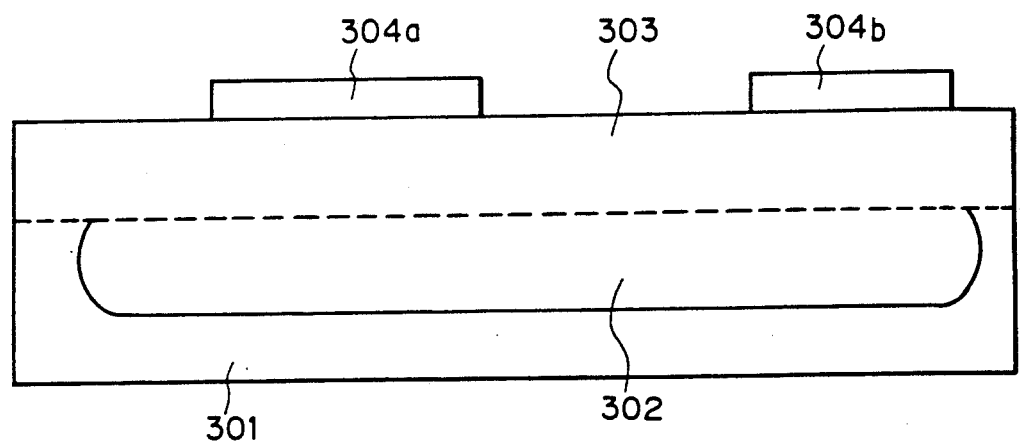
FIGS. 3(A) to 3(K) depict a process according to a third embodiment of the present invention for the fabrication of a bipolar transistor device.

In the third embodiment, an N+-type buried layer 302 is formed in a P−-type silicon substrate 301 as is shown in FIG. 3(A). An N−-type epitaxial layer 303 is thereafter allowed to grow on the entire surface. Resist patterns 304a,304b are then formed on the surface of the N−-type epitaxial layer 303 by a conventional photolithographic technique.

Figure 3B:
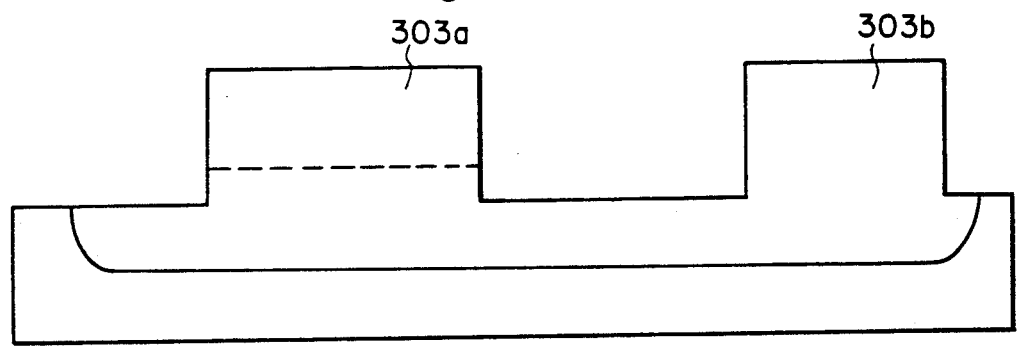

Using the resist patterns 304a,304b as masks, the epitaxial layer 303 is next subjected to anisotropic etching, whereby, as is shown in FIG. 3(B), portions of the epitaxial layers 303 are allowed to remain in the form of lands, namely, as a collector region 303a and a collector lead region 303b and the remaining portion is removed.

Figure 3C:
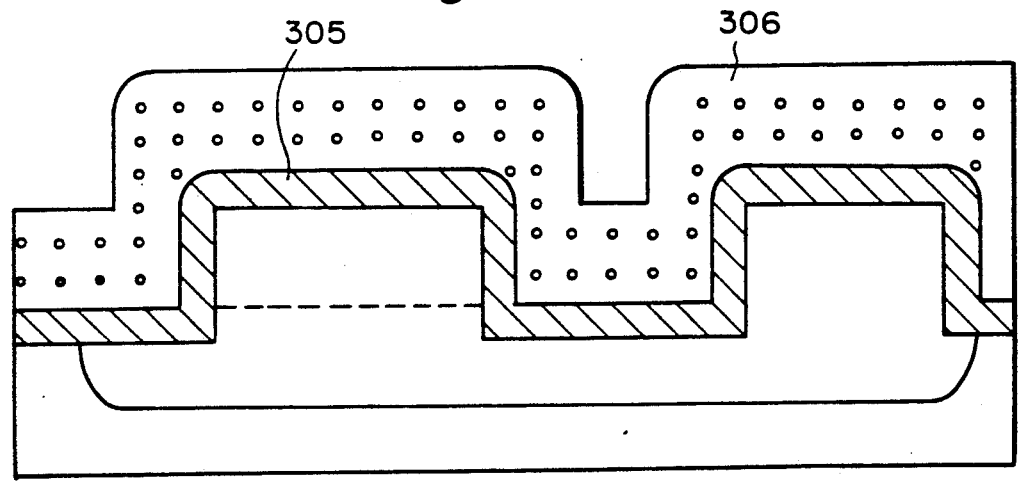
Figure 3D:
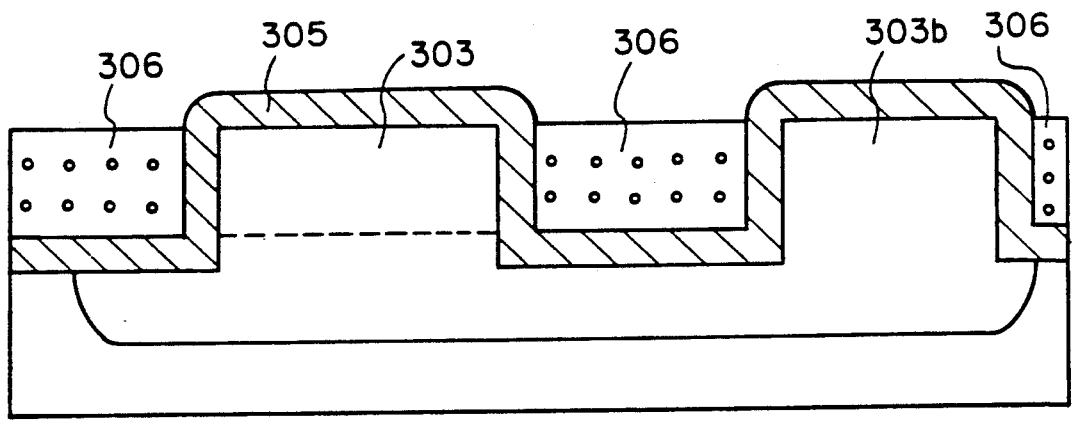

After the resist patterns 304a,304b are removed, an N-type dopant is introduced into the collector lead region 303b to convert it to an N+-region. A silicon nitride film 305 is then formed as an oxidation-resistant film to a thickness of 0.5–1.0 μm on the surface of the semiconductor substrate, said surface having been roughened by the etching, as is depicted in FIG. 3(C). Further, polycrystalline silicon 306 is allowed to deposit on the silicon nitride film 305 by a CVD process. After a resist is coated on the polycrystalline silicon 306 to make the surface flat, the resist and polycrystalline silicon 306 are etched back by an etching technique having the same etch rate for the resist and polycrystalline silicon. As is shown in FIG. 3(D), the polycrystalline silicon 306 is therefore allowed to remain in the recesses in the semiconductor substrate, namely, in the regions surrounding the collector region 303a and the collector lead region 303b.

Figure 3E:
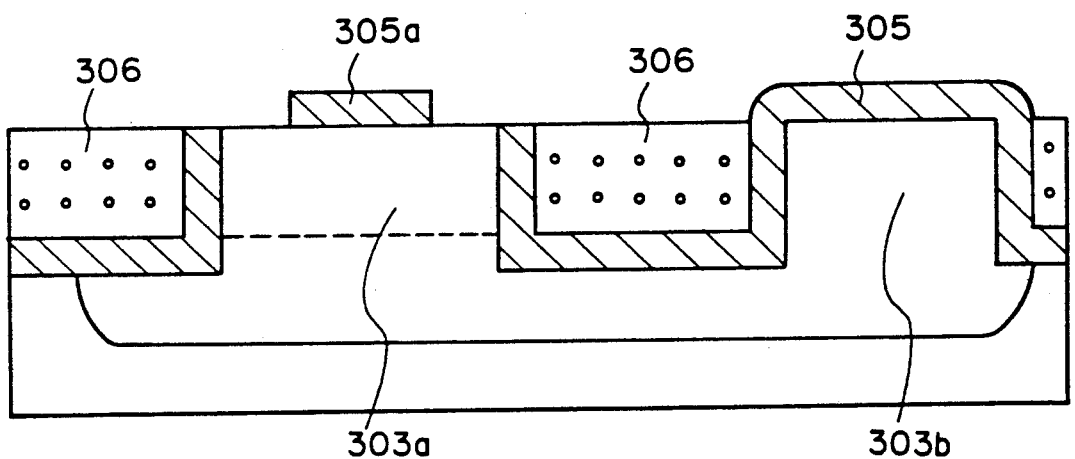

The silicon nitride film 305 exposed on the surface of the collector region 303a is next patterned by a conventional photolithographic etching technique so that, as is depicted in FIG. 3(E), a patterned silicon nitride film 305a is formed on a central part of the collector region 303a.

Using as masks the patterned silicon nitride film 305a and the silicon nitride film 305 still remaining on the collector lead region 303b without being patterned, O+

Figure 3F:
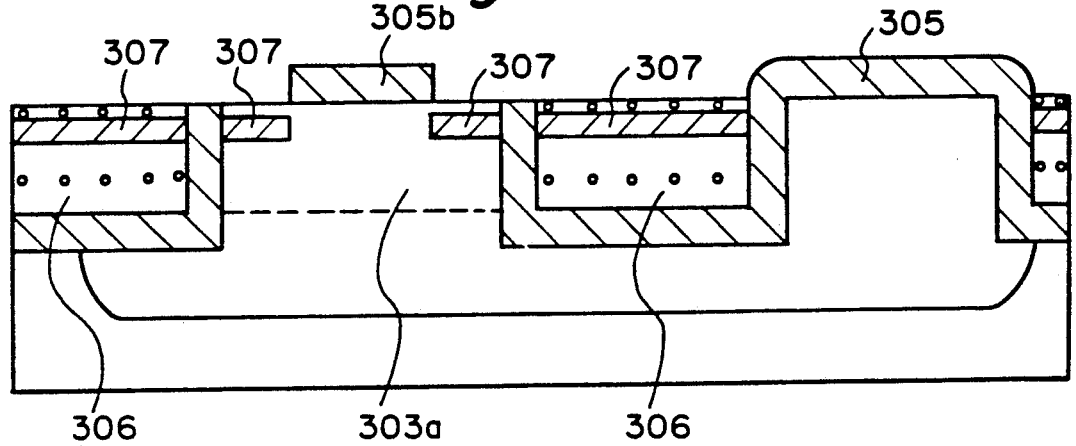
Figure 3G:
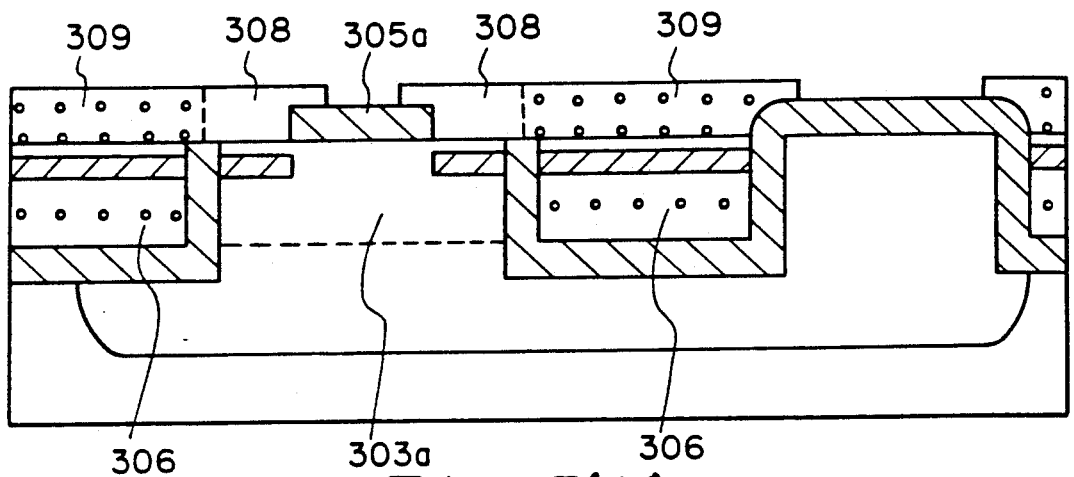

(oxygen ions) are implanted at an acceleration energy of about 200 keV into the collector region 303a and the polycrystalline silicon 306. The dosage is set at $1.2 \times 10^{18}$ cm$^{-2}$. Annealing is next conducted at 1,150° C. for 2 hours, whereby the portions of the collector regions 303a and polycrystalline silicon 306, said portions having been implanted with O+, are converted to silicon oxide films 307 as illustrated in FIG. 3(F). Under the above conditions, the silicon oxide films 307 are formed with a thickness of 3,800 Å within the collector region 303a and polycrystalline silicon 306 at depths of about 1,500 Å below the surface of the collector region 303a and polycrystalline silicon 306. In the collector region 303a, the silicon oxide film 307 is formed within a peripheral portion which is other than that lying underneath the patterned silicon nitride film 305a. No silicon oxide film is formed in the regions right underneath the patterned silicon nitride pattern 305a and the silicon nitride film 305 as the patterned silicon nitride film 305a and the silicon nitride film 305 serve as masks upon ion implantation. It is to be noted that the formation of the silicon oxide film 307 within the polycrystalline silicon 306 is not essential, although the silicon oxide film 307 can reduce the capacitance and therefore improve the performance.

Next, the polycrystalline silicon 306 on the silicon oxide film 307 in each region where the polycrystalline silicon 306 is not needed may be removed if necessary. Selective epitaxial growth of silicon is then conducted by using, as seed crystals, the portion of the collector region 303a, said portion lying above the silicon oxide film 307, and the polycrystalline silicon 306. As a result of the selective epitaxial growth, a selective epitaxial layer 308 (FIG. 3(G)) is formed on the collector region 303a while covering a part of the patterned silicon nitride film 305a owing to lateral solid-phase growth. At the same time, a polycrystalline silicon layer 309 is also formed on the polycrystalline silicon 306 so that the polycrystalline silicon layer 309 extends to the selective epitaxial layer 308.

Figure 3H:
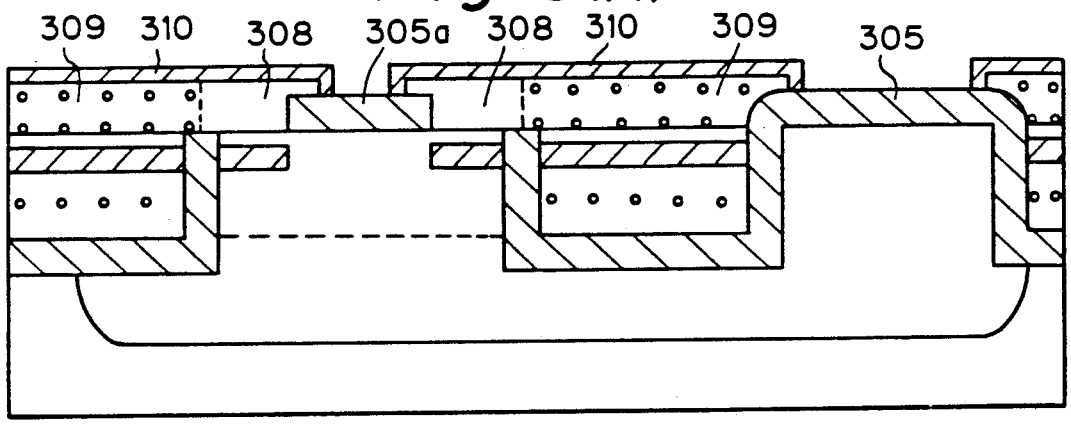

Surface layers of the selective epitaxial layer 308 and polycrystalline silicon layer 309 are then converted to a silicon oxide film 310 by a thermal oxidation process as is shown in FIG. 3(H). B+ (boron ions) are next implanted into the selective epitaxial layer 308 and polycrystalline silicon layer 309 through the silicon oxide film 310. Here, no B+ ions are implanted into the regions lying right underneath the patterned silicon nitride film 305a and the silicon nitride film 305 as these films 305a,305 serve as masks upon ion implantation.

Figure 3I:
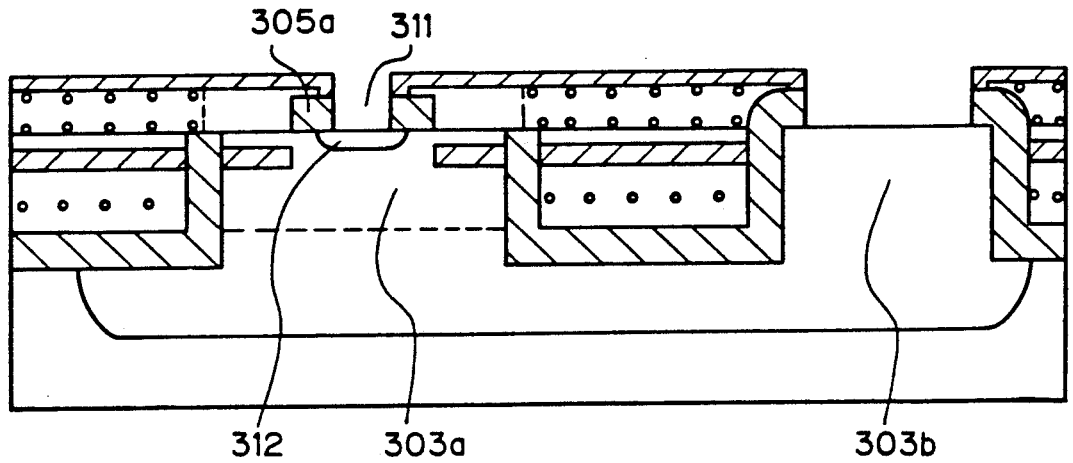

Etching of the patterned silicon nitride film 305a and silicon nitride film 305 is next carried out by using the silicon oxide films 310 as masks. As a result, as is shown in FIG. 3(I), the surface of the collector lead region 303b is exposed, and an opening 311 is centrally formed in the patterned silicon nitride film 305a so that the surface of the collector region 303a is exposed in the bottom of the opening 311. The collector lead region 303b whose surface is exposed is then covered with a resist by a photolithographical technique. B+ ions are then implanted to a central surface portion of the collector region 303a through the opening 311, so that a P-type region 312 is formed as an active base in the central surface portion.

Figure 3J:
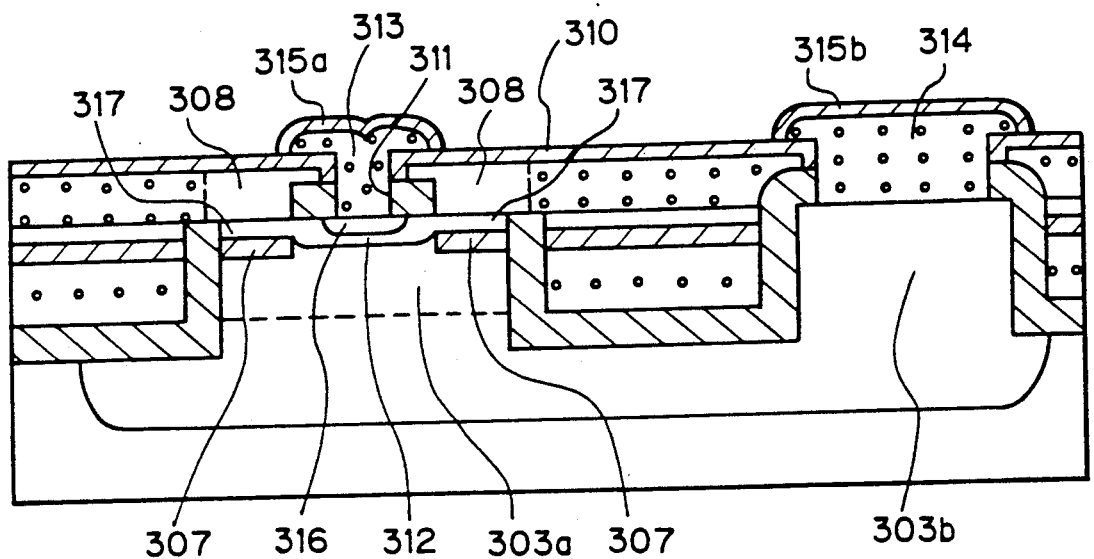

Next, polycrystalline silicon is caused to deposit on the entire surface. After As+ (arsenic ions) are implanted in the polycrystalline silicon, the polycrystalline silicon is subjected to patterning by using a photolithographic technique so that, as is shown in FIG. 3(J), an emitter electrode 313 of polycrystalline silicon and a collector electrode 314 of polycrystalline silicon are formed. Here, the emitter electrode 313 is formed so that it fills up the opening 311 and partly covers the surrounding silicon oxide film 310. The surfaces of the emitter electrode 313 and collector electrode 314 are then covered by silicon oxide films 315a,315b, respectively.

Heat treatment is then applied to induce diffusion of arsenic from the emitter electrode 313 into the p-type region 312 so that, as is illustrated in FIG. 3(J), an N+-type region 316 is formed as an emitter in the P-type region 312. Since boron is allowed to diffuse from the selective epitaxial layer 308 into the portion of the collector region 303a, said portion lying above the silicon oxide film 307, the collector region 303 is converted at the above portion to a P-type region 317 as an inert base connected to the P-type region 312.

Figure 3K:
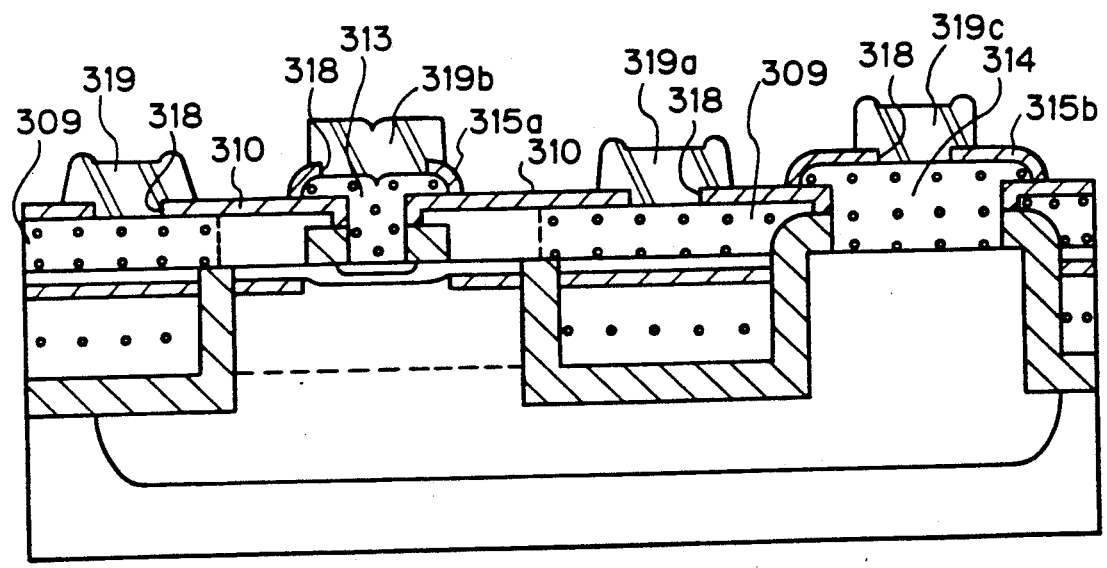

Subsequently, as is shown in FIG. 3(K), contact holes 318 are formed through the silicon oxide films 310,315a,315b at positions above the polycrystalline silicon layer 309, the emitter electrode 313 and the collector electrode 314. Formed through the contact holes 318 are a base metal electrode 319a, an emitter metal electrode 319b and a collector metal electrode 319c, which are connected to the polycrystalline silicon layer 309, the emitter electrode 313 and the collector electrode 314 respectively.

By the above procedures, a device similar to that fabricated by the process of the second embodiment as is shown in FIGS. 2(A) to 2(L) has been completed with a base contact provided on each polycrystalline silicon layer 309 formed by the self-alignment technique.

What is claimed is:

1. A process for the fabrication of a bipolar semiconductor device having a substrate, said substrate defining a major surface, and a collector region of a first conductivity type formed within the substrate at a position adjacent to the working surface, which comprises the following steps:

(a) forming a patterned, oxidation-resistant film on a predetermined portion of the collector region;
   (b) forming a silicon oxide film region within the collector region at a position spaced downwardly from an exposed surface of the collector region;
   (c) forming a selective epitaxial layer of a second conductivity type such that said selected epitaxial layer extends from the exposed surface of the collector region to a portion of a top part of the patterned, oxidation-resistant film;
   (d) removing a portion of the patterned, oxidation-resistant film, said portion being free of said selective epitaxial layer, to expose said collector region;
   (e) forming a base region of the second conductivity type so that the base region extends from the thus-exposed surface of the collector region to the silicon oxide film region; and
   (f) forming an emitter region of the first conductivity type within the base region at a position adjacent to the exposed surface of the collector region.

2. The process of claim 1, wherein the exposing step (d) further comprises forming a silicon oxide film on the selective epitaxial layer.

3. The process of claim 1, wherein the base region forming step (e) comprises the following substeps:

implanting dopant ions of the second conductivity type into the exposed collector region while using the patterned, oxidation-resistant film as a mask, thereby forming a first region of the second conductivity type; and subjecting the selective epitaxial layer to heat treatment such that a second region of the second conductivity type is formed between the selective epitaxial layer and the silicon oxide film region at a position adjacent to the first region of the second conductivity type.

4. The process of claim 1, wherein the emitter region forming step (f) comprises the following substeps:

embedding polycrystalline silicon in the removed portion of the patterned, oxidation-resistant film; and diffusing dopant ions from the polycrystalline silicon into the base region by heat treatment.

* * * * *